United States Patent
Perret-Gentil et al.

(10) Patent No.: US 10,379,637 B2
(45) Date of Patent: Aug. 13, 2019

(54) ROTATIONAL ELEMENT ENABLING TOUCH-LIKE GESTURES

(71) Applicant: Logitech Europe S.A., Lausanne (CH)

(72) Inventors: Arnaud Perret-Gentil, Lausanne (CH); Daniel Bonanno, Lausanne (CH); Patrick Edouard Jean Cerisier, Annecy le View (FR); Darragh Luttrell, Cork (IE); Nicolas Ramond, Lugrin (FR); Jaroslav Jirousek, Degnis (CH)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 14/611,014

(22) Filed: Jan. 30, 2015

(65) Prior Publication Data

US 2016/0224133 A1 Aug. 4, 2016

(51) Int. Cl.
*G06F 3/0362* (2013.01)
*G06F 3/0354* (2013.01)
*G06F 3/01* (2006.01)
*G06F 3/03* (2006.01)
(Continued)

(52) U.S. Cl.
CPC ............ *G06F 3/0362* (2013.01); *G06F 3/017* (2013.01); *G06F 3/0312* (2013.01); *G06F 3/03541* (2013.01); *G06F 3/03543* (2013.01); *G06F 3/044* (2013.01); *H03K 17/962* (2013.01); *H03K 2017/9602* (2013.01); *H03K 2217/96077* (2013.01)

(58) Field of Classification Search
CPC ...... G06F 3/0362; G06F 3/0312; G06F 3/044; G06F 3/017; G06F 3/03543; G06F 3/03541; H03K 17/962; H03K 2017/9602; H03K 2217/96077
See application file for complete search history.

(56) References Cited

U.S. PATENT DOCUMENTS 4,891,632 A 1/1990 Chang
5,473,344 A 12/1995 Bacon et al.
(Continued)

FOREIGN PATENT DOCUMENTS

WO 2007/121777 A1 11/2007
WO WO 2007/121777 A1 11/2007
(Continued)

OTHER PUBLICATIONS

Extended European Search Report for EP 16152263.6, dated Jun. 7, 2016, 9 pages.
(Continued)

*Primary Examiner* — Nicholas J Lee
*Assistant Examiner* — Gerald L Oliver
(74) *Attorney, Agent, or Firm* — Kilpatrick Townsend & Stockton LLP

(57) ABSTRACT

In one embodiment, the present invention provides an input device with a mechanical wheel which includes a touch sensor. In one embodiment, the wheel is a thumbwheel that uses a magnetometer to detect rotation of a magnet inside the thumbwheel. The touch sensor in one embodiment is a cylindrical floating electrode which is capacitively coupled to a bridge electrode connected to a sensing circuit. The thumbwheel may be used for horizontal scrolling, zoom and other gestures.

18 Claims, 8 Drawing Sheets

(51) Int. Cl.
  *G06F 3/044* (2006.01)
  *H03K 17/96* (2006.01)

(56) References Cited

U.S. PATENT DOCUMENTS

| | | | |
|---|---|---|---|
| 5,573,088 A * | 11/1996 | Daniels | B60G 17/0157 |
| | | | 188/267 |
| 5,712,725 A | 1/1998 | Faltermeier et al. | |
| 5,771,038 A | 6/1998 | Wang | |
| 5,872,528 A | 2/1999 | Gaultier et al. | |
| 5,883,619 A | 3/1999 | Ho et al. | |
| 5,917,473 A | 6/1999 | Yeh | |
| 6,115,029 A | 9/2000 | Jaaskelainen, Jr. et al. | |
| 6,198,473 B1 | 3/2001 | Armstrong | |
| 6,525,713 B1 | 2/2003 | Soeta et al. | |
| 6,859,196 B2 | 2/2005 | Kehlstadt | |
| 6,879,316 B2 | 4/2005 | Kehlstadt | |
| 7,468,603 B2 * | 12/2008 | Kang | G06F 3/0362 |
| | | | 324/207.2 |
| 7,623,116 B1 | 11/2009 | Bidville | |
| 8,686,944 B1 | 4/2014 | Charlton et al. | |
| 9,030,418 B2 * | 5/2015 | Ku | G06F 3/0416 |
| | | | 345/156 |
| 2002/0063688 A1 * | 5/2002 | Shaw | G06F 3/0312 |
| | | | 345/163 |
| 2002/0067334 A1 | 6/2002 | Hinckley et al. | |
| 2002/0180701 A1 * | 12/2002 | Hayama | G06F 3/0312 |
| | | | 345/163 |
| 2004/0174336 A1 * | 9/2004 | Bohn | G06F 3/0312 |
| | | | 345/156 |
| 2007/0188455 A1 | 8/2007 | O-Connell et al. | |
| 2008/0243375 A1 * | 10/2008 | Han | G01C 21/367 |
| | | | 701/455 |
| 2009/0237371 A1 * | 9/2009 | Kim | G06F 3/0485 |
| | | | 345/173 |
| 2010/0085321 A1 * | 4/2010 | Pundsack | G06F 3/0202 |
| | | | 345/173 |
| 2011/0025311 A1 * | 2/2011 | Chauvin | G01D 5/145 |
| | | | 324/207.25 |
| 2012/0169595 A1 * | 7/2012 | Nien | G06F 3/0362 |
| | | | 345/158 |
| 2013/0004921 A1 * | 1/2013 | Takahashi | G09B 21/004 |
| | | | 434/113 |
| 2013/0120259 A1 | 5/2013 | Piot et al. | |
| 2013/0120262 A1 * | 5/2013 | Piot | G06F 3/03541 |
| | | | 345/163 |
| 2013/0257729 A1 | 10/2013 | Edwards | |
| 2013/0257807 A1 * | 10/2013 | Harris | G06F 3/0418 |
| | | | 345/175 |
| 2014/0002362 A1 * | 1/2014 | Srivastava | G06F 3/03549 |
| | | | 345/167 |
| 2014/0085177 A1 * | 3/2014 | Lyons | G06F 3/014 |
| | | | 345/156 |
| 2015/0138093 A1 * | 5/2015 | Young | G06F 3/0312 |
| | | | 345/166 |
| 2015/0286295 A1 * | 10/2015 | Pepe | G06F 3/0362 |
| | | | 345/163 |
| 2016/0307604 A1 * | 10/2016 | Hirajoh | H04N 21/858 |

FOREIGN PATENT DOCUMENTS

| | | |
|---|---|---|
| WO | 2014/047674 A1 | 4/2014 |
| WO | WO 2014/047674 A1 | 4/2014 |

OTHER PUBLICATIONS

First Office Action for EP Patent Application No. 16 152 263.6, dated Feb. 20, 2018, 7 pages.
First Office Action for CN Application No. 201610059871.X, dated Mar. 14, 2018, 6 pages.
Summons to attend oral proceedings pursuant to Rule 115(1) EPC for EP Application No. 16152263.6 dated Feb. 21, 2019, 9 pages.

* cited by examiner

ROTATIONAL ELEMENT ENABLING TOUCH-LIKE GESTURES

BACKGROUND OF THE INVENTION

The present invention relates to input devices with a rotational element, such as a thumbwheel on a mouse.

Mice have been designed with various scrolling wheels on top, and sometime have a thumb wheel on the side. One example is Logitech U.S. Pat. No. 8,686,944, which shows a thumb wheel used for zoom and other features. The thumb wheel can be pressed for a button activation. Other embodiments of a thumbwheel are described in Logitech Pub. 20070188455, which also describes the prior art below.

A switch or dial on the side of a mouse that can be activated by a thumb has been described in many different designs. U.S. Pat. No. 4,891,632 shows a track ball that can be manipulated by a user's thumb. Microsoft U.S. Pat. No. 5,473,344 shows a thumb wheel which is an elongated roller that can be depressed by pivoting around one end for a clicking switch. U.S. Pat. No. 5,712,725 shows a mouse with a side, thumb actuated rotational transducer for controlling microscope focus. The transducer generates a pulse train proportional to the rotational angle.

Primax U.S. Pat. No. 5,771,038 shows a number of different thumb actuated switches for the side of a mouse, including a ball, a microstick and a dial. The dial using two tuning disks with variable capacitance. Primax U.S. Pat. No. 5,917,473 shows a mouse with a side, thumb actuated dial which encodes using electrical brushes. The dial can be depressed for a click switch function. IBM U.S. Pat. No. 6,115,029 shows a side thumb dial on a mouse.

Alps U.S. Pat. No. 6,525,713 shows, as prior art, a mouse with an automatic return sliding switch between the buttons on the top of a mouse. This patent goes on to show a jog/shuttle switch on the front and side of a mouse. These switches are wheels, located on top of each other, with a jog switch providing continuous pulses in accordance with rotation of the jog dial, while a shuttle switch provides pulses corresponding to the rotational angle and direction.

Armstrong U.S. Pat. No. 6,198,473 shows forward and backward pressure sensitive buttons on the side of a mouse in FIG. 32, with varied speeds of video frame rates depending on the amount of pressure applied. Primax U.S. Pat. No. 5,883,619 shows a rounded control button which can be tilted in x-y directions to produce scrolling. The '619 patent also shows a bidirectional thumb button on the side of a mouse for controlling zoom.

Logitech U.S. Pat. No. 7,623,116, "Roller with Multiple Force Sense Levels," shows a roller which can pivot with two levels of force activating two stage buttons or pressure sensitive buttons. Logitech U.S. Pat. No. 6,879,316 shows a scroll wheel with pressure sensitive buttons on either side for activating continuous scrolling.

Proximity detection in a mouse, such as to awaken a mouse from sleep mode when a user's hand approaches, is shown in Logitech U.S. Pat. No. 6,859,196.

Smart phones and tablets use touch screens with a variety of gestures used for input controls. There have been attempts to incorporate gesture capability on other input devices. For example, Logitech Pub. No. 20130120259 describes a solid state touch sensor for a user's thumb on a mouse, enabling gesture detection.

A challenge with implementing a mechanical thumb roller on the side of a mouse is fitting the needed components in the available space. There are advantages to a mechanical thumb wheel, and there are different advantages to a touch sensor (gesture detection).

BRIEF SUMMARY OF THE INVENTION

In one embodiment, the present invention provides an input device with a mechanical rotational element and an associated touch sensor. The combination of rotation of the rotational element, and touch and lift off detected by the touch sensor, can be used to generate gestures. The touch sensor can also be used for an activation, or button press, function, eliminating the need for the rotational element to be mechanically depressible in addition to being rotatable.

In one embodiment, a mechanical wheel design with a touch sensor allows it to be placed in the constrained space for a thumbwheel on a user input device, such as a mouse. The design uniquely combines wheel touch detection with high resolution (<1°) angular sensor in a very compact form factor.

In one embodiment, the invention reproduces a multi-finger touch experience using a mechanical horizontal wheel. It brings an advanced touch user experience into basic controls. On top of standard horizontal scroll, it enables computer controls like smooth back & forward or smooth application page control.

In one embodiment, a thumbwheel uses a magnetometer to detect rotation of the thumbwheel. The thumbwheel has an internal, disk shaped magnet with radial north and south poles, to allow detection of radial position. A small magnet allows close placement of the magnetometer, providing enough signal without saturation. Near the outer surface of the thumbwheel is a cylindrical floating electrode for capacitive touch detection. The floating electrode is covered with a rubber grip, which acts as an insulator. The electrode is capacitively coupled to an electrode on a printed circuit board (PCB). This eliminates the need for a wire connection and enables the touch detector to be mounted in the rotating thumbwheel itself. Thus use of a touch sensor eliminates the need to depress the thumbwheel for a "click" activation.

DETAILED DESCRIPTION OF THE INVENTION

Figure 1:
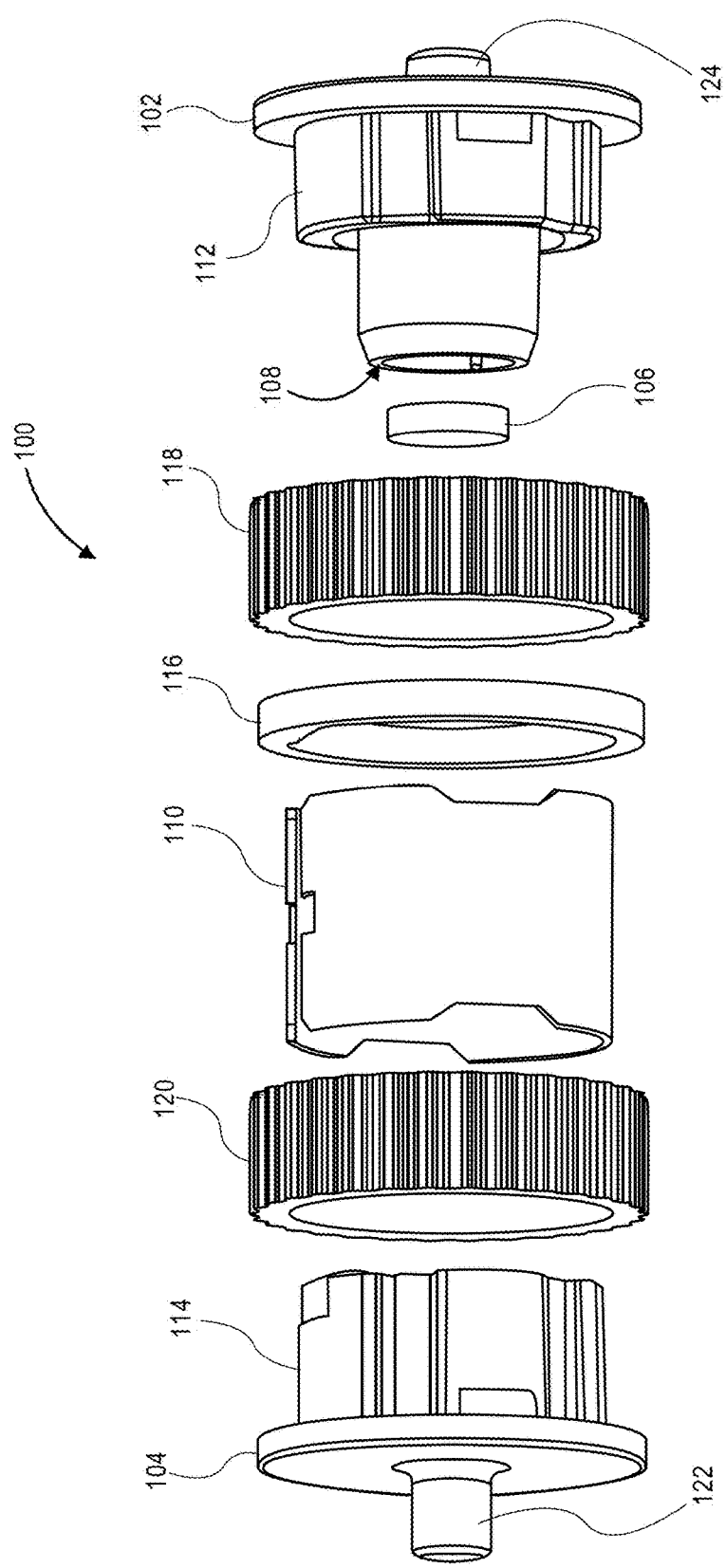
FIG. 1 is an exploded view of a thumbwheel according to an embodiment of the invention.

FIG. 1 is an exploded view of a thumbwheel 100 according to an embodiment of the invention. The thumbwheel has a right body portion 102 and a left body portion 104. Axles 122 and 124 extend from body portions 104 and 102. Body portions 102 and 104 can be made of plastic. A disk shaped magnet 106 is mounted into an opening 108 in right body 102. A copper floating electrode 110 is placed over interior portions 112 and 114 of right body 102 and left body 104, respectively. A cosmetic ring 116 is pushed on over the center of copper electrode 110, followed by rubber grips 118 and 120 on either side.

Figure 2:
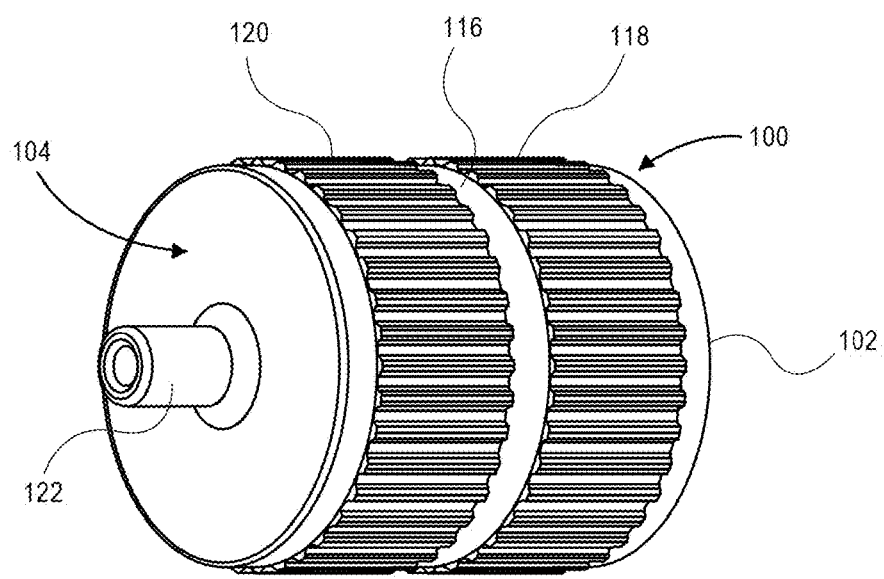
FIG. 2 is a diagram of the assembled thumbwheel of FIG. 1.

FIG. 2 shows the assembled thumbwheel 100 of the embodiment of FIG. 1. In one embodiment, the disk shaped magnet 106 is 3 mm in diameter and 1 mm thick. It has radial north and south poles. Electrode 110 is copper in one embodiment. Alternately, it could be aluminum or another material. In one embodiment, the electrode is a phosphorus-copper alloy. Phosphorus is added to make the copper stronger, so that it will hold its position after forming. The material of this electrode, and the connected electrode described below, on the wheel should be paramagnetic in order to not perturb the magnetic field used for angular position detection. The same applies to any coating or paint on the wheel or other structures. Such a coating or paint, on the plastic parts or otherwise, should be a patent with no metal filings.

Figure 3:
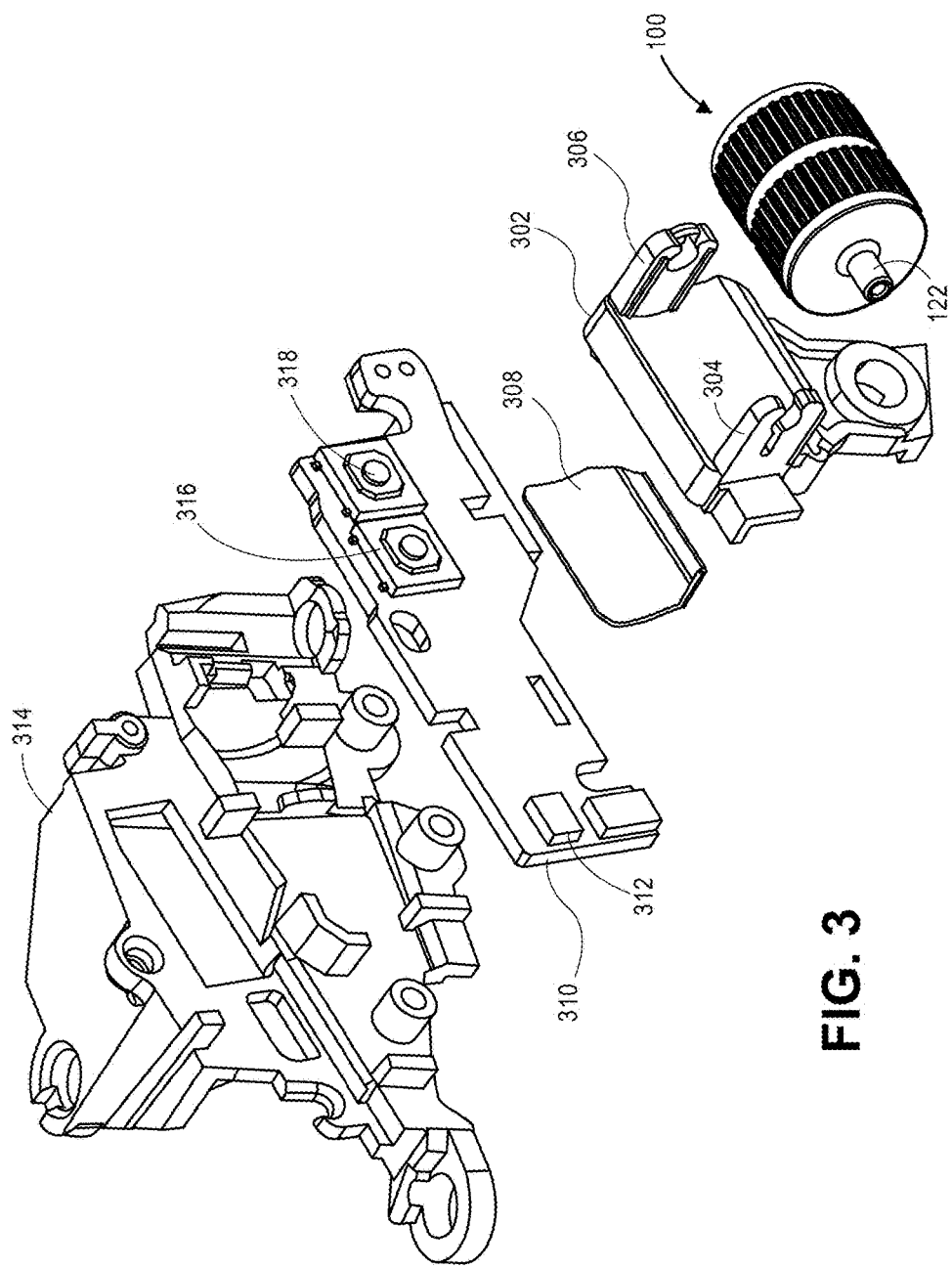
FIG. 3 is an exploded view of a mounting module for the thumbwheel of FIG. 1, according to one embodiment of the invention.

FIG. 3 is an exploded view of a mounting module for the thumbwheel of FIG. 1, according to one embodiment of the invention. Thumbwheel 100 is mounted on a bearing 302. Axles 122 and 124 (not visible) snap into arms 304 and 306 of bearing 302. A bearing grease is applied to the axles and/or the holes in arms 304 and 306. The grease has sufficient viscosity to dampen the movement of the roller, to avoid small, unintended movements of the thumbwheel when a user's thumb is simply resting on the thumbwheel. In addition, debouncing firmware or software can additionally be used to limit such unintended movements, similar to that used for finger scrolling wheels.

Figure 4:
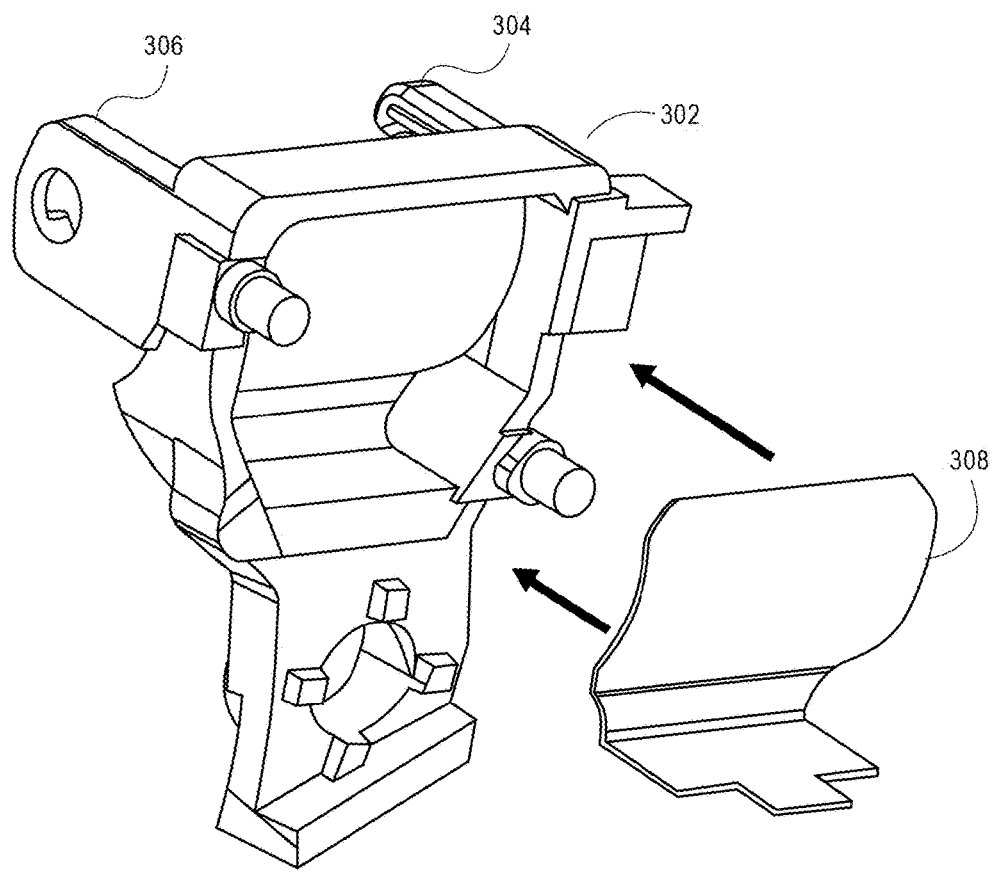
FIG. 4 is a diagram illustrating the assembly of the connected electrode of FIG. 3 on the bearing of FIG. 3.

A connected electrode 308 is attached to the backside of bearing 302, as shown in more detail in FIG. 4. A PCB 310 attaches to the back of bearing 302. The PCB includes a magnetometer 312 for sensing the angular position of the magnet and thumbwheel 100. The position of magnetometer 312 is close to the magnet 106 and thumbwheel 100, yet sufficiently far to intersect the magnetic field at a proper distance from the magnet to allow optimum detection. A plastic portion of bearing 302 covers magnetometer 312 when assembled, to shield it from any electrostatic discharge (esd). A thumb module housing 314 will hold the combined assembly of the thumbwheel 100, bearing 302 and PCB 310, while itself being attached to the mouse or other input device.

For the position of magnetometer 312 as shown in the embodiment of FIG. 3, the magnet used has an axial polarization. This ensures that the magnetometer is positioned within a portion of the magnetic field of the magnet which provides maximum magnetic field intensity and variation of the magnetic field as the thumbwheel is rotated.

A pair of switches 316 and 318 are mounted on PCB 310 used for separate back and forward buttons on a mouse. Not shown, but LEDs or other light sources can be provided to give feedback to the user when the user's thumb is detected to touch the thumbwheel, or to lift off.

FIG. 4 is a diagram illustrating the assembly of the connected electrode of FIG. 3 on the bearing of FIG. 3. Connected electrode 308 can be made of copper, or alternately aluminum or another material. In one embodiment, connected electrode 308 is mounted in bearing 302 as shown, then soldered onto PCB 310.

Figure 5:
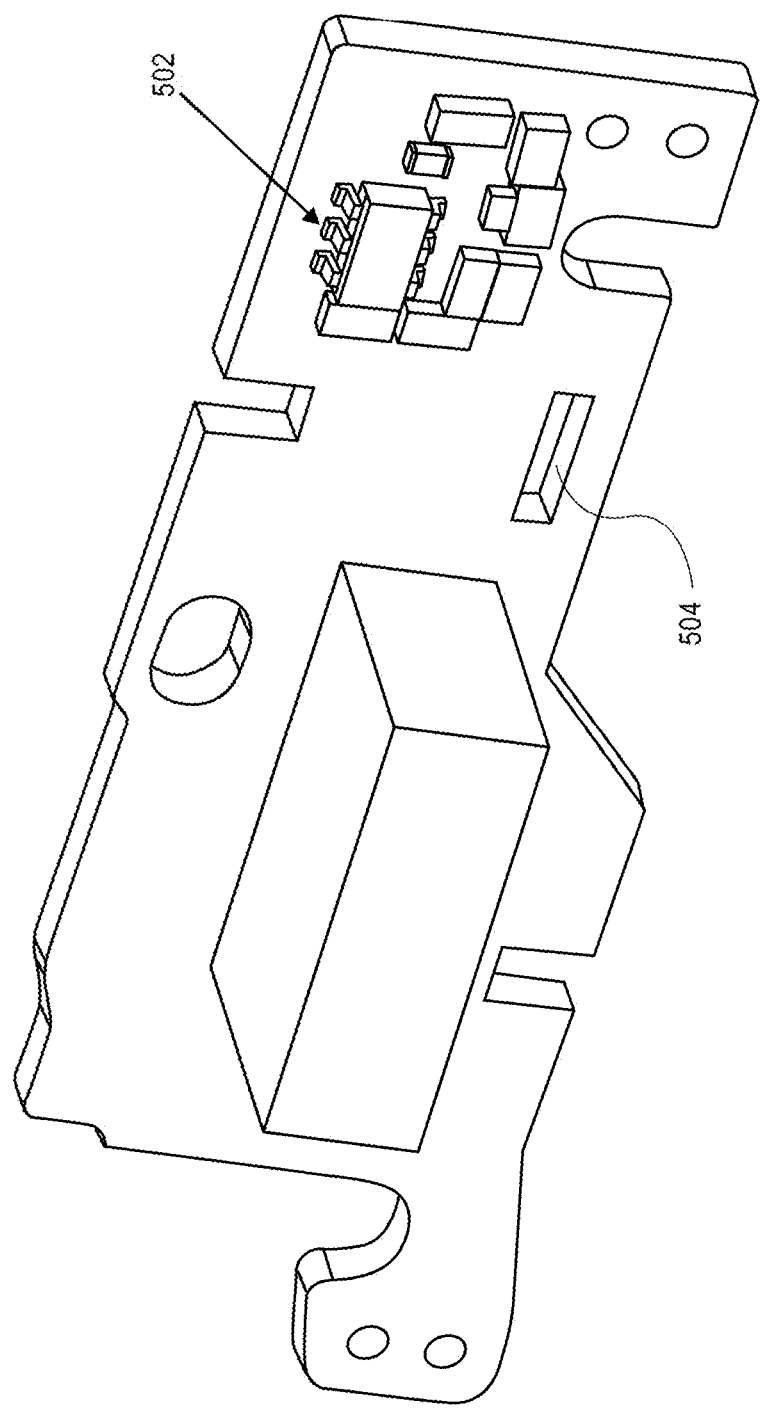
FIG. 5 is a diagram of the backside of the PCB of the mounting module of FIG. 3, according to one embodiment of the invention.

FIG. 5 is a diagram of the backside of the PCB of the mounting module of FIG. 3, according to one embodiment of the invention. A touch detection integrated circuit 502 is connected to solder placed through an opening 504 to connect to connected electrode 308 on the opposite side of the PCB. Through holes in the PCB also connect the circuitry on the backside to the magnetometer 312 on the opposite side of the PCB.

Figure 6:
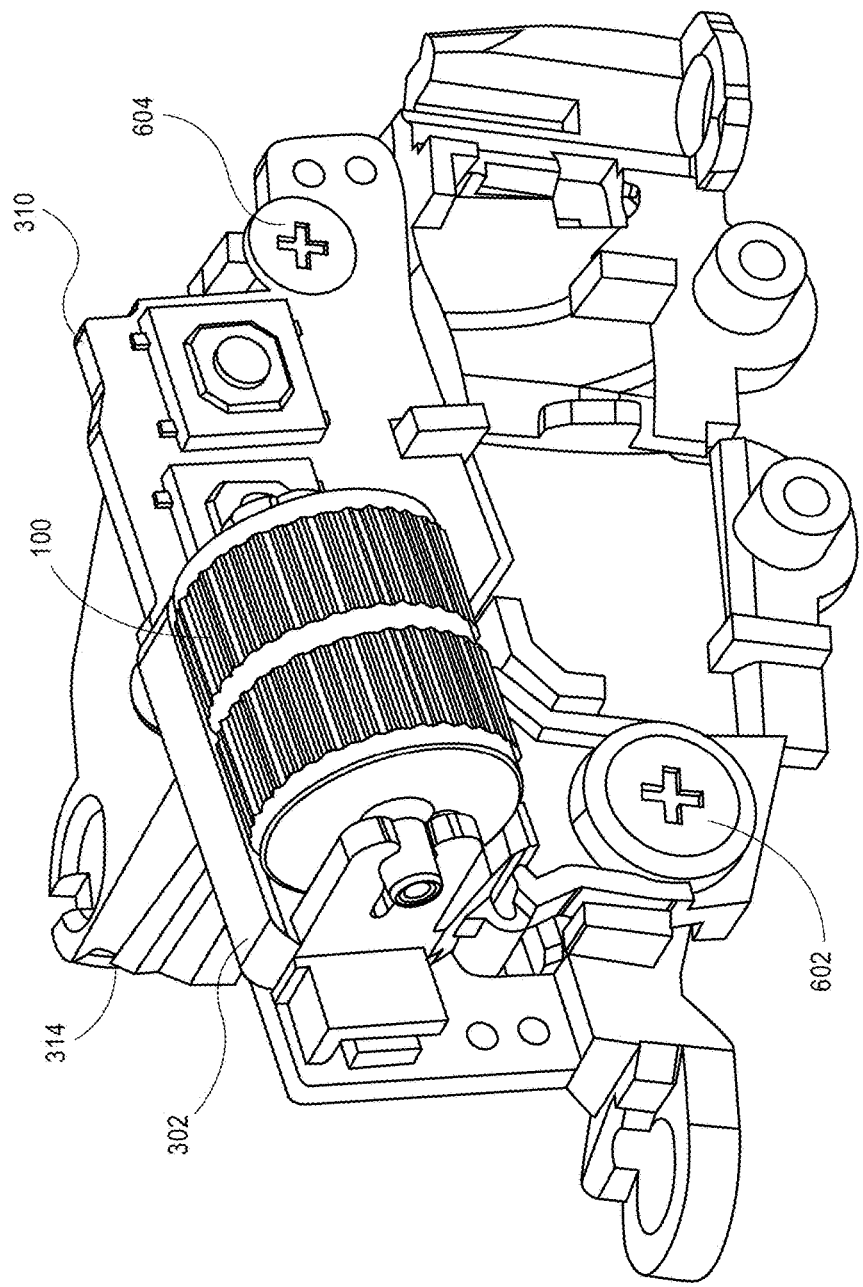
FIG. 6 is a diagram of an assembled thumbwheel of FIG. 1 and mounting module of FIG. 3, according to one embodiment of the invention.

FIG. 6 is a diagram of an assembled thumbwheel of FIG. 1 and mounting module of FIG. 3, according to one embodiment of the invention. The thumbwheel 100, bearing 302 and PCB 310 are mounted on module housing 314 using a screw 602. Screw 604 attaches PCB 310 to housing 314.

Figure 7:
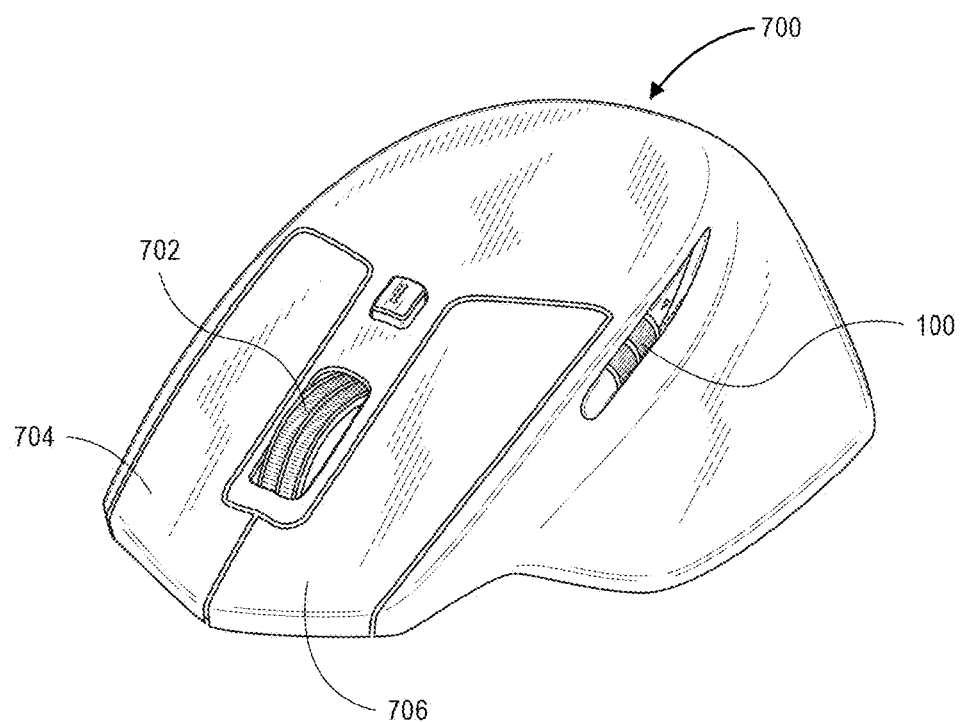
FIG. 7 is a perspective view of a mouse including the thumbwheel of FIG. 1, according to one embodiment of the invention.

FIG. 7 is a perspective view of a mouse 700 including the thumbwheel of FIG. 1, according to one embodiment of the invention. Mouse 700 also includes a finger-activated scrolling wheel 702 and buttons 704 and 706. The thumbwheel 100 has a much small diameter than finger wheel 702, since the most comfortable use of a thumb provides less movement than a finger. The smaller diameter allows a larger movement with a small movement of the thumb.

In operation, floating electrode 110 acts as a bridge to connected, sensing electrode 308 to provide an indication of a user touch or proximity to the thumbwheel. The control signal generated by the touch sensor could be generated in hardware, firmware or software. The signal could provide an activation upon the finger being lifted off the thumbwheel, placed on the thumbwheel, or both. The control signals can be the same touch control signals used on a touch surface of a smartphone or table, with the obvious limitation that movements would not be detected for a single electrode embodiment (such as a swipe or fingers squeezing together or moving apart.

Calibration

For each input device, such as a mouse, the particular magnet field of magnet 106 may vary, as well as the receptive characteristics of magnetometer 312. Accordingly, each device can be calibrated using a test station. The test station has a motor that engages the wheel, and a probe which measures the magnetometer output. The maximum and minimum values along each axis of the electromagnetic field, as detected, are recorded and mapped to the rotational location of the thumbwheel. The mapped values can be used as a look-up table to indicate the amount of rotation, or can be used as a correction factor for a magnetometer output.

Gestures

Any number of gestures can be implemented. For a basic operation, the building blocks for gestures are thumb ON, thumb OFF, tap, double tap and rotation (scroll/zoom). In one embodiment, the building blocks can be mapped to different gestures, taking into account that the finger scroll wheel 702 provides the ability to generate other gestures. For example, the rotation of the thumbwheel can be mapped to a two finger movement (e.g., scroll), while movement of the finger wheel is mapped to a single finger scroll.

In one embodiment, a double tap on the thumbwheel is used to change the function of the thumbwheel. For example, it can change from horizontal scrolling to zoom (with the finger wheel being used for vertical scrolling).

In one embodiment, the lifting of the thumb off the thumbwheel is detected, and used to stop the movement on a display. In another embodiment, if the velocity of the thumbwheel is above a predetermined threshold, the thumb lifting off does not stop the movement, but the movement continues for a period of time.

In one embodiment, maintaining a button press (such as left/right button) and rotating the wheel will change a function (such as a modifier key on a keyboard). In one example, for a wheel on a keyboard, a back/forward command is sent by default when the wheel is rotated, and a left click+wheel rotation sends a horizontal scroll event.

In one embodiment, a freewheel movement can be emulated by using the capacitive touch sensor. As soon as the finger is removed from the wheel, the speed (starting speed) is recorded and a decay rate is applied until the speed is null. The decay rate and the starting speed can be adjustable by the user.

Figure 8:
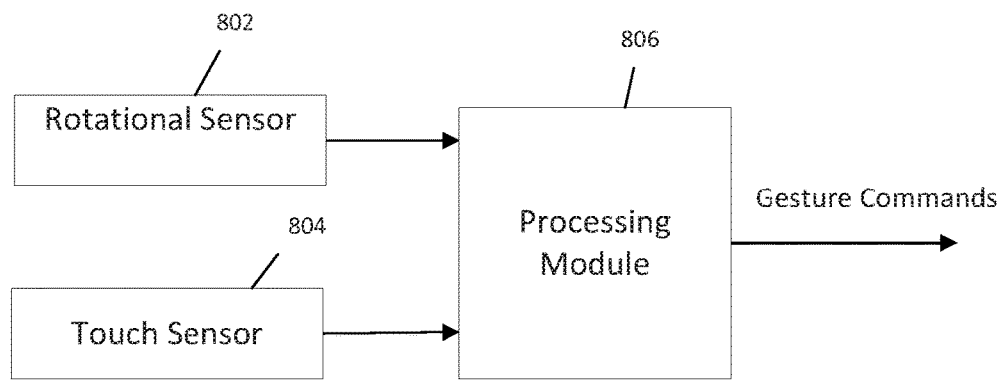
FIG. 8 is a diagram showing gesture command output is responsive to rotation sensor and touch sensor inputs.

FIG. 8 is a diagram showing a rotation sensor 802 and a touch sensor 804 which provide signals to a processing module 806. The output of the processing module 806 is a gesture command.

Alternate Embodiments

Various alternate embodiments are possible within the scope of the invention as set forth in the appended claims. For example, instead of a magnetometer, other rotational sensors could be used in combination with the touch sensor. For example, hall sensors, optical sensors or mechanical sensors (e.g., high resolution mechanical variable resistor sensors) could be used.

In another embodiment, the floating sensor could be replaced with a fixed electrode positioned at the edges of the thumbwheel, such that the user's thumb can turn the wheel, while portions of the users thumb lightly contact, or are sufficient close, to the fixed electrode so as to provide touch detection. In such an embodiment, the touch sensor could be resistive or capacitive.

In alternate embodiments, a small swipe action could be detected by using multiple ring electrodes, instead of a single, cylindrical floating electrode, along with multiple connected electrodes to detect which ring is being primarily touched, to indicate a direction of movement.

In another embodiment, the input device is a trackball. Alternately, the input device can be a joystick, gamepad, remote control, keyboard, touchpad, or any other input device. In alternate embodiments, the wheel is located where it can be activated by a finger rather than a thumb.

In other embodiments, the wheel could be replaced with a ball or any other rotational element. The touch sensor could be any type of touch sensor, including optical, pressure, capacitive or other touch sensors. The rotational element and touch sensor can be mounted at any location on a consumer electronic device such as mouse (top, side, side bottom), keyboard or presenter.

What is claimed is:

1. An input device, comprising:
   a housing;
   at least one input element for providing a computer input from the input device;
   a mechanical rotational element partially protruding from the housing such that portions of the surface of the mechanical rotational element contacted by the user are rotated to positions inside the housing inaccessible to the user's touch during a portion of the rotation of the mechanical rotational element;
   a rotational sensor for indicating rotational movement of the mechanical rotational element, the rotational sensor having a rotational sensing element mounted in the mechanical rotational element and a rotational detection element mounted in the housing of the input device proximate the rotational element;
   a touch sensor for indicating one of touch and proximity of a portion of a user's hand to the rotational element, the touch sensor having a proximity sensing element mounted in the mechanical rotational element and a proximity detection element mounted in the housing of the input device outside and proximate the mechanical rotational element; and
   a processing module, coupled to the rotational and proximity detection elements, and configured to control a movement on a display in response to the rotational element and to stop the movement on the display in response to a signal from the proximity element indicating the absence of the user's touch or proximity to the mechanical rotational element, such that continued movement of the rotational element in the absence of the user's touch does not cause movement on the display, responsive to a signal from the proximity detection element.

2. The input device of claim 1:
   wherein the rotational sensing element comprises a magnet internally mounted in the rotational element; and
   wherein the rotational detection element comprises a magnetometer mounted near the rotational element.

3. The input device of claim 2 wherein the rotational element is a wheel and the magnet is disk shaped with radial north and south poles.

4. The input device of claim 3 wherein the magnetometer is mounted offset from the wheel, to one side and farther inside the input device than the wheel.

5. The input device of claim 1:
   wherein the proximity sensing element is a capacitive sensing element;
   wherein the proximity detection elements is a capacitive detection element;
   wherein the capacitive sensing element comprises a floating electrode mounted in the mechanical rotational element;
   wherein the capacitive detection element comprises a bridge electrode mounted outside and adjacent the mechanical rotational element and a detection circuit connected to the bridge electrode.

6. The input device of claim 5 wherein:
   the mechanical rotational element is a wheel;
   the floating electrode is a cylindrical electrode mounted near an exterior surface of the wheel; and
   further comprising an insulator mounted on the wheel to cover the cylindrical electrode.

7. The input device of claim 6 further comprising a bearing module for supporting the wheel; and
   wherein the bridge electrode contains a flat, rectangular portion mounted directly behind the wheel, on a side of the bearing module opposite the wheel.

8. The input device of claim 6 wherein the insulator is a rubber grip with an uneven outer surface for griping by a user.

9. The input device of claim 1 wherein the mechanical rotational element is a thumbwheel and the input device is a mouse.

10. The input device of claim 1 further comprising a processing module for generating gesture commands responsive to signals from the rotational and touch sensors.

11. The input device of claim 10 wherein the gesture commands include a horizontal scrolling gesture and a double tap gesture to change mode.

12. The input device of claim 11 wherein the change mode acts to change between a horizontal scrolling mode and a zoom mode.

13. The input device of claim 1 wherein:
   the mechanical rotational element comprises a mechanical thumb wheel mounted on a side of the input device;

the rotational sensor for indicating rotational movement comprises
   the rotational sensing element comprising a magnet internally mounted in said mechanical thumb wheel, and
   the rotational detection element comprising a magnetometer mounted near the mechanical thumb wheel; and
the touch sensor for indicating proximity of a portion of a user's hand to the mechanical thumb wheel, the touch sensor comprising
   the capacitive sensing element comprising a floating electrode mounted in the mechanical thumb wheel,
   the capacitive detection element comprising a bridge electrode mounted outside and adjacent the mechanical thumb wheel, and
   a detection circuit connected to the bridge electrode.

14. The input device of claim 13 wherein:
the floating electrode is a cylindrical electrode mounted near an exterior surface of the mechanical thumb wheel; and
   further comprising an insulator mounted on the mechanical thumb wheel to cover the cylindrical electrode.

15. The input device of claim 1 wherein the processing module is configured to generate a zoom or horizontal scroll gesture commands responsive to signals from the rotational and touch sensors, and wherein the zoom or horizontal scroll gesture is stopped in response to the signal from the proximity element indicating the absence of the user's touch or proximity to the mechanical rotational element.

16. A mouse comprising:
a mouse input for indicating a desired command with the mouse;
a mechanical thumb wheel mounted on a side of the mouse;
a first sensor for indicting rotational movement of the mechanical thumb wheel, the first sensor comprising
   a magnet internally mounted in said mechanical thumb wheel, and
   a magnetometer mounted near the mechanical thumb wheel;
a second, touch sensor for indicating proximity of a portion of a user's hand to the mechanical thumb wheel, the touch sensor comprising
   a floating electrode mounted in the mechanical thumb wheel,
   a bridge electrode mounted outside and adjacent the mechanical thumb wheel, and
   a detection circuit connected to the bridge electrode;
a processing module for generating gesture commands responsive to signals from the first and second sensors; and
wherein the gesture commands include a horizontal scrolling gesture and a double tap gesture to change mode; and wherein the processing module is configured to control a movement on a display in response to the first sensor and to stop the movement on the display in response to the second sensor indicating the absence of the user's touch or proximity to the mechanical thumb wheel, such that continued movement of the mechanical thumb wheel in the absence of the user's touch does not cause movement on the display, responsive to a signal from the detection circuit.

17. An input device, comprising:
a housing;
at least one input element for providing a computer input from the input device;
a mechanical wheel partially protruding from the housing such that portions of the surface of the mechanical wheel contacted by the user are rotated to positions inside the housing inaccessible to the user's touch during a portion of the rotation of the mechanical wheel;
a magnetic rotational sensor for indicating rotational movement of the mechanical wheel, the magnetic rotational sensor having
a magnet internally mounted in the mechanical wheel, and
a magnetometer mounted outside and near the mechanical wheel;
a capacitive touch sensor for indicating one of touch and proximity of a portion of a user's hand to the mechanical wheel, the capacitive touch sensor having
a floating electrode mounted in the mechanical wheel,
a bridge electrode mounted outside and adjacent the mechanical wheel, and
a detection circuit connected to the bridge electrode;
an insulator mounted on the wheel to cover the floating electrode; and
a processing module for generating commands responsive to signals from the rotational and touch sensors; and
wherein the processing module is configured to control a movement on a display in response to the magnetic rotational sensor and to stop the movement on the display in response to the capacitive touch sensor indicating the absence of the user's touch or proximity to the mechanical wheel, such that continued movement of the mechanicalwheel in the absence of the user's touch does not cause movement on the display, responsive to a signal from the detection circuit.

18. The input device of claim 17 wherein
the magnet is disk shaped with radial north and south poles;
the magnetometer is mounted offset from the mechanical wheel, to one side and farther inside the input device than the mechanical wheel; and
the bridge electrode contains a flat, rectangular portion mounted directly behind the wheel, on a side of a bearing module opposite the wheel.

* * * * *